United States Patent
Kubota

(10) Patent No.: US 6,605,372 B1
(45) Date of Patent: Aug. 12, 2003

(54) ORGANIC ELECTROLUMINESCENT ELEMENT AND METHOD OF REPAIRING THE SAME

(75) Inventor: Hirofumi Kubota, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/572,434

(22) Filed: May 17, 2000

(30) Foreign Application Priority Data

May 19, 1999 (JP) .......................................... 11-138371

(51) Int. Cl.$^7$ .............................................. H05B 33/14
(52) U.S. Cl. ...................... 428/690; 428/917; 257/100; 313/506; 313/509; 313/512; 427/66
(58) Field of Search .......................... 257/99, 100, 103; 313/506, 509, 512; 428/690, 917; 427/66

(56) References Cited

U.S. PATENT DOCUMENTS

| | | | | |
|---|---|---|---|---|
| 5,891,554 A | * | 4/1999 | Hosokawa et al. ......... 428/212 |
| 5,953,585 A | * | 9/1999 | Miyaguchi ................. 438/35 |
| 5,968,612 A | * | 10/1999 | Takayama et al. .......... 427/579 |
| 6,048,630 A | * | 4/2000 | Burrows et al. ............ 428/690 |
| 6,091,196 A | * | 7/2000 | Codama ..................... 313/504 |
| 6,121,994 A | * | 9/2000 | Kuribayashi et al. ....... 347/237 |
| 6,172,459 B1 | * | 1/2001 | Hung et al. ................. 313/506 |
| 6,225,218 B1 | * | 5/2001 | Yamazaki et al. .......... 438/660 |
| 6,335,716 B1 | * | 1/2002 | Yamazaki et al. ............ 345/92 |

* cited by examiner

Primary Examiner—Cynthia H. Kelly
Assistant Examiner—Dawn Garrett
(74) Attorney, Agent, or Firm—Sughrue Mion, PLLC

(57) ABSTRACT

An organic electroluminescent element and a method of repairing the organic electroluminescent element that solve a problem of a failure in luminescence and a failure in an electroluminescent element caused by the current leak are provided. The organic electroluminescent element according to the present invention includes transparent electrodes, a plurality of organic material layers and metal electrodes being formed in order on a transparent board and contains a protective layer for preventing current leak formed between the transparent board and a plurality of the organic material layers, wherein the protective layer for preventing current leak and/or a part of a plurality of the organic material layers is evaporated by absorbing an irradiated laser beam.

7 Claims, 5 Drawing Sheets

LASER BEAM

ORGANIC ELECTROLUMINESCENT ELEMENT AND METHOD OF REPAIRING THE SAME

BACKGROUND OF THE INVENTION (1) Field of the Invention

This invention relates to an organic electroluminescent element and a method of repairing the same.

(2) Description of the Related Art

FIGS. 7 and 8 illustrate an example of a simple matrix drive-type conventional electroluminescent display unit employing an organic electroluminescent element, wherein FIG. 7 illustrates a schematic structure of the conventional electroluminescent display unit and FIG. 8 illustrates an arrangement of transparent electrodes and metal electrodes.

As shown in FIGS. 7 and 8, a plurality of transparent electrodes 2 made of indium tin oxide (hereinafter, ITO) are arranged in parallel with each other on a transparent board 1, on which an organic material layer 3 is formed and on the organic material layer 3, a plurality of metal electrodes 4 are arranged in parallel with each other in such a relation as to be at right angles to the transparent electrodes 2.

When a current or a voltage is applied between the transparent electrodes 2 and the metal electrodes 4 (see FIG. 8), a current flows through the organic material layer 3 between the transparent electrodes 2 and the metal electrodes 4, to which the current or the voltage is applied, arranged orthogonally with each other, thereby resulting in luminescence.

The organic material layer 3 and the metal electrodes 4 are formed by depositing respective materials by using an evaporation method and the like after the transparent electrodes 2 are formed on the transparent board 1.

At this time, as shown in FIG. 9, when a dirt 10 adheres onto the transparent electrode 2, evaporated molecules of the organic material are scarcely deposited onto spot indicated by arrow A in the figure situated in the shadow of the dirt 10, causing the organic material layer 3 in the vicinity of the spot to become thin.

As a result, a distance between the transparent electrode 2 and the metal electrode 4 in the vicinity of the spot decreases, decreasing a electrical resistance therebetween and resulting in a current leak caused by an excess concentration of a current, further causing a failure in luminescence and that in an electroluminescent element.

SUMMARY OF THE INVENTION

It is therefore an objective of the present invention to solve the above problem of a failure in luminescence and a failure in an electroluminescent element caused by the current leak and to provide an organic electroluminescent element and a method of repairing the same.

In order to attain the above objective, a first aspect of the present invention is to provide an organic electroluminescent element including transparent electrodes, a plurality of organic material layers and metal electrodes being formed in order on a transparent board, comprising a protective layer for preventing current leak formed between the transparent board and a plurality of the organic material layers, wherein the protective layer for preventing current leak and/or a part of a plurality of the organic material layers is evaporated by absorbing an irradiated laser beam.

A second aspect of the present invention is to provide a method of repairing an organic electroluminescent element including transparent electrodes, a plurality of organic material layers and metal electrodes being formed in order on a transparent board and comprising a protective layer for preventing current leak formed between the transparent board and a plurality of the organic material layers, characterized in that a laser beam, having substantially the same wavelength as an absorption wavelength of a material of the protective layer for preventing current leak and/or an organic material which forms a specific organic material layer from among a plurality of the organic material layers, is irradiated onto the protective layer for preventing current leak and/or the specific organic material layer so as to evaporate the protective layer for preventing current leak and/or the specific organic material layer.

The laser beam is irradiated from the transparent board side and absorbed by the specific organic material layer that is in contact with the transparent electrodes.

DESCRIPTION OF THE PREFERRED EMBODIMENTS

In the following, the preferred embodiments of the present invention will be explained with reference to the attached drawings.

Figure 1:
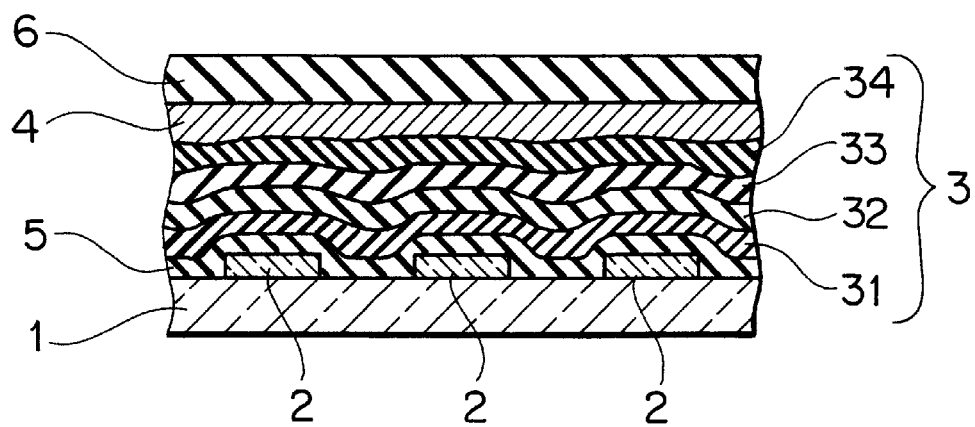
FIG. 1 is a cross sectional view of an organic electroluminescent element according to a preferred embodiment of the present invention.

FIG. 1 is a cross sectional view of an organic electroluminescent element according to a preferred embodiment of the present invention, in which a transparent board 1, transparent electrodes 2, a plurality of organic material layers 3 and a metal electrode 4 are shown.

A difference between the preferred embodiment according to the present invention and the conventional example is that a layer 5 for preventing current leak is formed between the transparent electrodes 2 and a plurality of the organic material layers 3 in the present invention and that a sealing film 6 is formed on the metal electrodes 4 in the present invention.

The layer 5 for preventing current leak, which is formed in order to be evaporated by an irradiation of a laser beam thereonto, is not expected to perform a function (i.e. transportation of holes) as an organic electroluminescent member. The layer 5 for preventing current leak is formed between the transparent board 1 and a plurality of the organic material layers 3 as a protective layer for preventing current leak or is a part of a plurality of the organic material 3. The layer 5 for preventing current leak can be made of an organic material, such as aluminum phthalocyanine (hereinafter, Al-pc), that does not deteriorate a performance of the organic electroluminescent element.

Therefore, even if the layer 5 for preventing current leak is not adopted into the organic electroluminescent element, there is no influence on an electroluminescent characteristic of the element. A material for the layer 5 for preventing current leak is selected from the viewpoint of having a high expansivity upon evaporation and a minimal adverse effect on the electroluminescent characteristic of the element.

Onto the transparent board 1 on which the transparent electrodes 2 are formed, the layer 5 for preventing current leak (consisting of Al-pc having thickness of 10 nm) is formed by a spin-coating, on which a hole-injection layer 31 (consisting of copper phthalocyanine (Cu-pc) having thickness of 35 nm), a hole-transportation layer 32 (consisting of triphenyldiamine (TPD) having thickness of 45 nm), an electroluminescent layer 33 (consisting of tris(8-quinolinolato)aluminum ($Alq_3$) having thickness of 55 nm), an electron-injection layer 34 (consisting of $Li_2O$ having thickness of 1 nm) and the metal electrodes 4 (consisting of aluminum having thickness of 100 nm) are deposited in order by an evaporation method and the like.

The sealing film 6 is made of a material, such as $SiN_2$, that adheres well to the metal electrode 4, that does not absorb a laser beam upon repair (explained later) by the laser beam, that does not crack under a pressure caused by an evaporation of the organic material, and that keeps its expanded shape.

When a dirt adheres onto the transparent electrode 2 of thus produced organic electroluminescent element, a portion where the dirt adheres becomes a current leaking position. By an observation using, for example, a microscope, the position is found, onto which a laser beam is irradiated from the transparent board 1 side.

Here, the laser beam of a wavelength which is absorbed by the layer 5 for preventing current leak is irradiated onto the layer 5 for preventing current leak.

Figure 2:
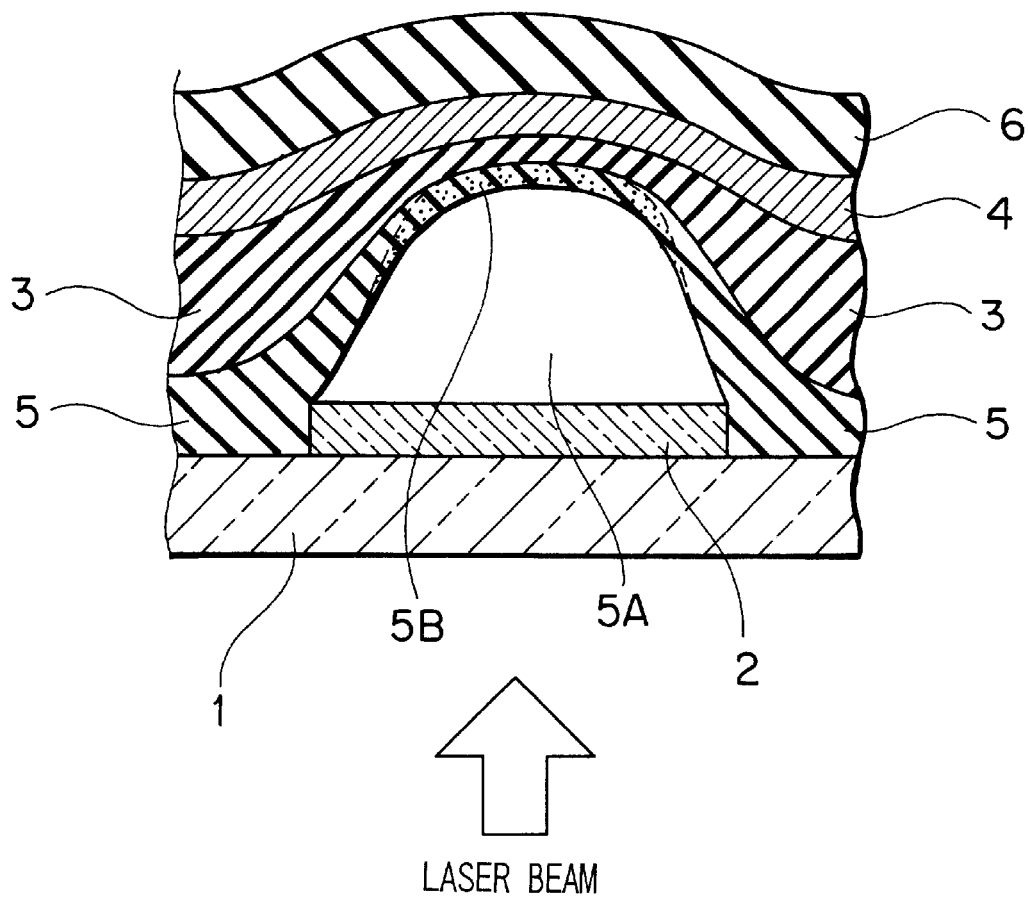
FIG. 2 is a cross sectional view of an organic electroluminescent element when a laser beam is irradiated thereonto.

When a laser beam having, for example, a wavelength of 680 nm, a power of 5 watts and a spot diameter of 1 $\mu$m $\phi$ is irradiated onto the layer 5 for preventing current leak made of Al-pc, the layer 5 for preventing current leak absorbs the laser beam and evaporates to form a space 5A by expansion as shown in FIG. 2.

When the layer 5 for preventing current leak evaporates and expands, the organic material layer 3, the metal electrodes 4 and the sealing film 6 are all pushed up to apart from the transparent electrodes 2, resulting in a stop of current leak.

Then, the irradiation of the laser beam is stopped to cool and solidify the evaporated Al-pc, whereby leaving the space 5A as being formed.

Therefore, the sealing film 6 must be stretchable so that it is not cracked under a pressure of evaporated gas, that is, even if the Al-pc evaporates to form the space 5A.

Figure 3:
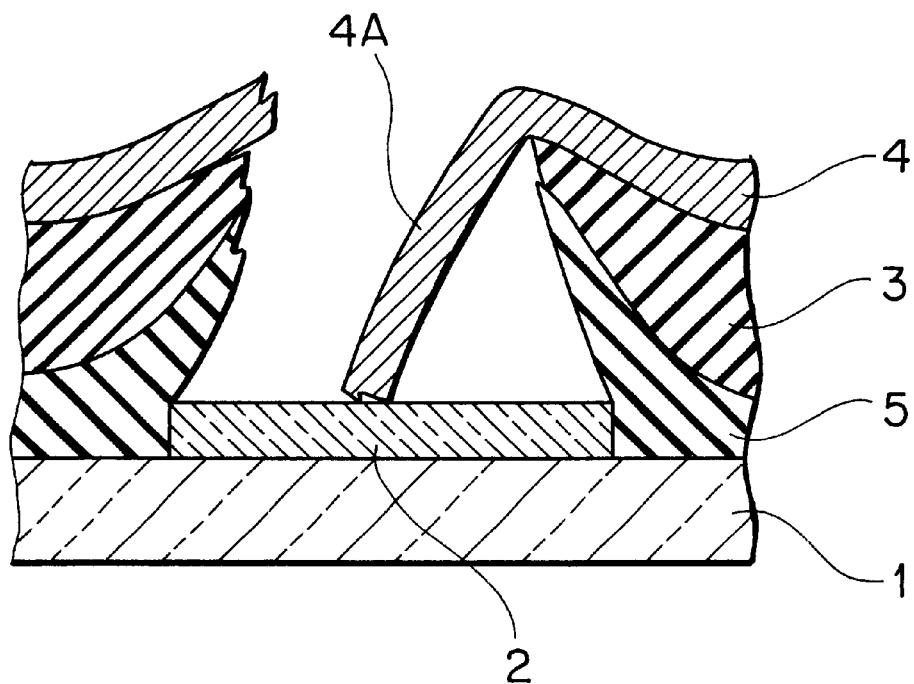
FIG. 3 is a cross sectional view of an organic electroluminescent element having no stretchable sealing film when a laser beam is irradiated thereonto.

If the sealing film 6 is not employed, as shown in FIG. 3, the metal electrodes 4 might be blown off by a high vapor pressure, causing no luminescence in a wide area of the organic electroluminescent element.

Further, as shown in FIG. 3, a piece 4A of the blown-off metal electrode 4 might fall onto the transparent electrode 2, resulting in that the metal electrode 4 might come into contact with the transparent electrode 2.

Although the metal electrodes 4 themselves have a function of preventing the organic material layer 3 from blowing off, it is safer to employ the sealing film 6, which is preferably made of a material having a good adhesiveness to the metal electrodes 4.

In the preferred embodiment, the laser beam is irradiated from the transparent board 1 side, to the contrary, they may be irradiated from the metal electrodes 4 side.

Figure 4:
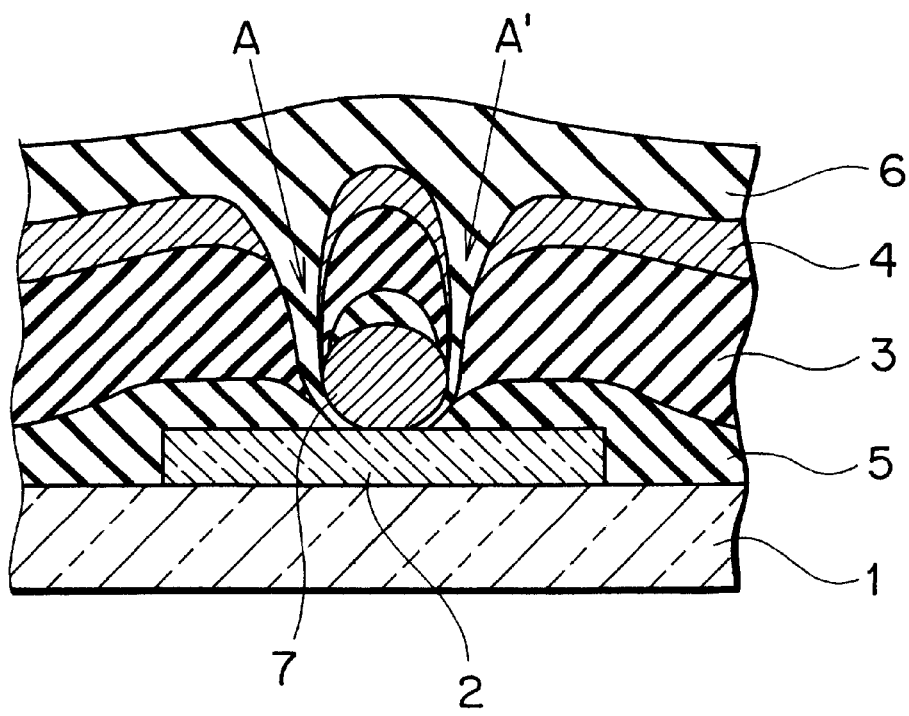
FIG. 4 is a cross sectional view of an organic electroluminescent element when a dirt adheres onto the transparent electrode.

As shown in FIG. 4, there is a dirt 7 at a current leaking position and therefore, there is a hole in the metal electrode 4, a portion of which is indicated by arrows A and A' at both sides of the dirt 7 in the figure. If the layer 5 for preventing current leak appears even a little from the hole, it can be expanded by irradiating the laser beam through the sealing film 6.

In this case, the laser beam irradiation is preferably performed for a wide area of the organic electroluminescent element instead of a spot irradiation, thereby expanding the layer 5 for preventing current leak in the vicinity of the hole exclusively, saving a step of searching for dirts by using a microscope.

Figure 5:
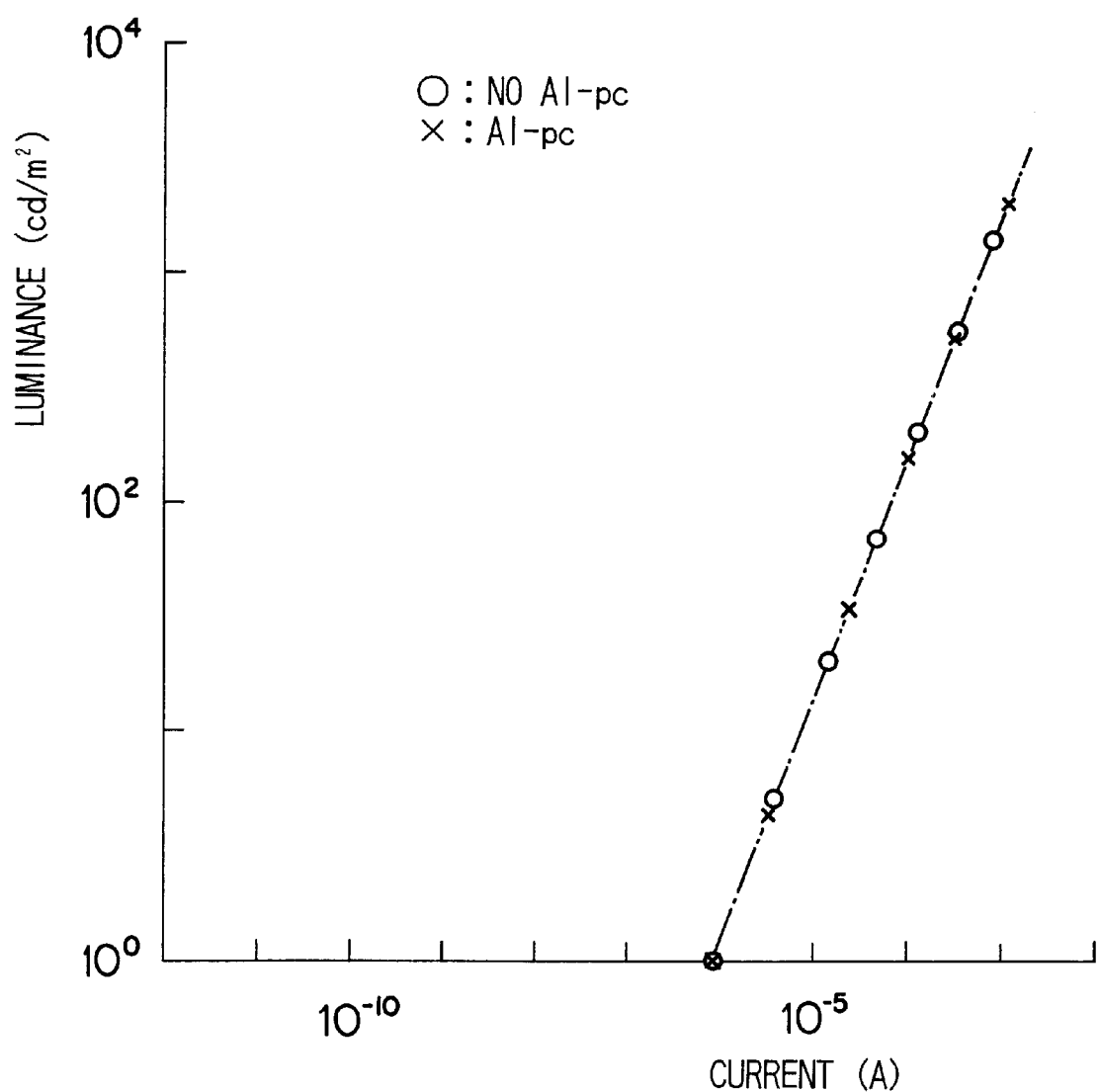
FIG. 5 illustrates current vs. luminance characteristics of an organic electroluminescent element having or not having a layer for preventing current leak made of aluminum phthalocyanine (Al-pc)
Figure 6:
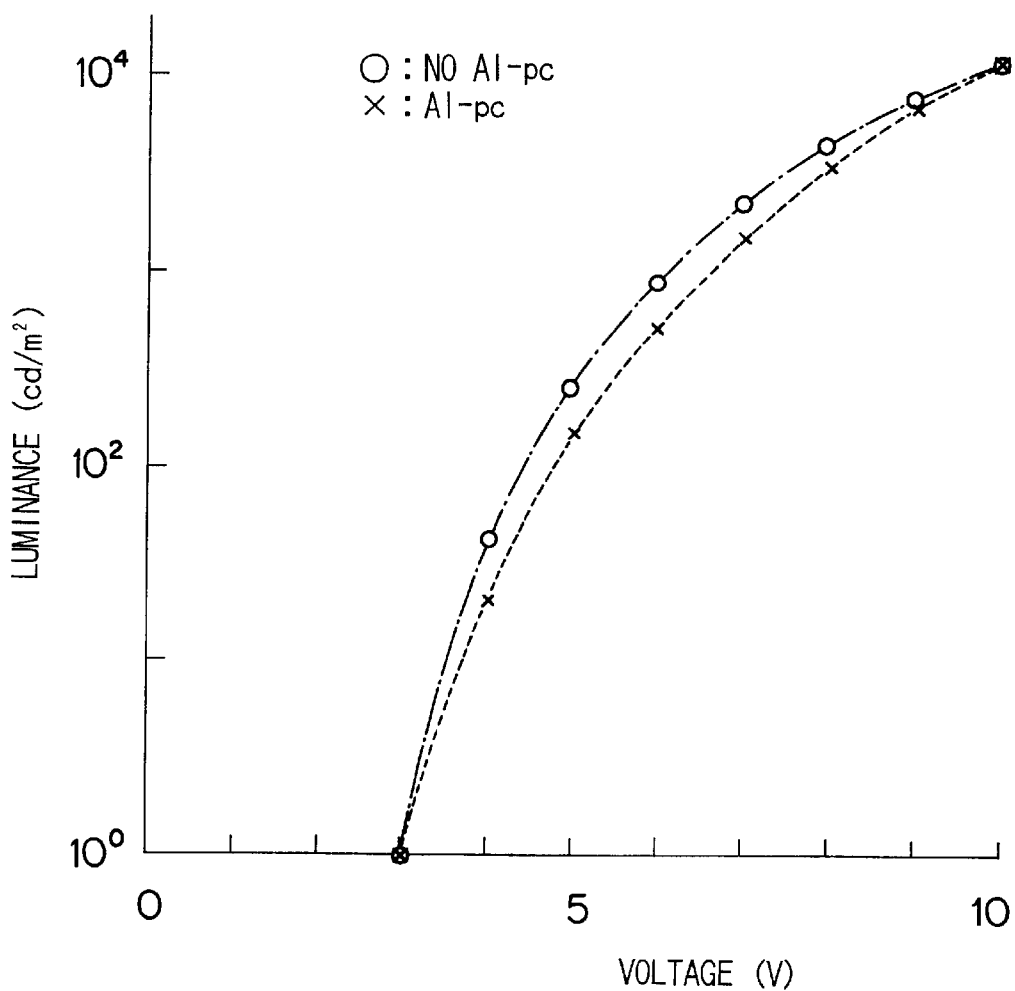
FIG. 6 illustrates voltage vs. luminance characteristics of an organic electroluminescent element having or not having a layer for preventing current leak made of aluminum phthalocyanine (Al-pc)
Figure 9:
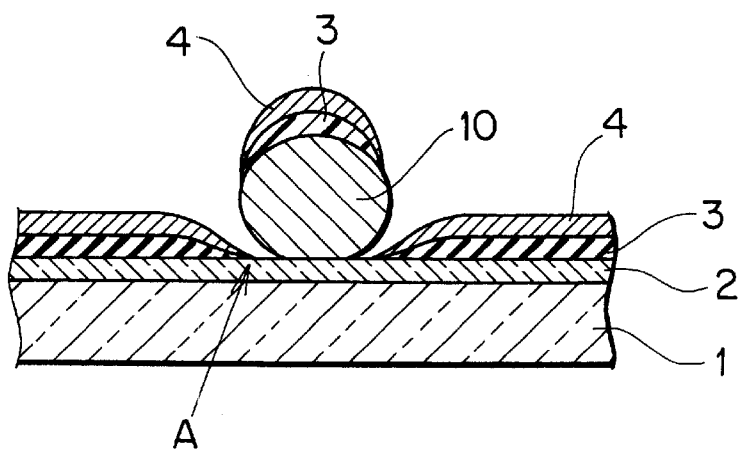
FIG. 9 illustrates a situation when a dirt adheres onto the transparent electrode of the organic electroluminescent element.
Figure 7:
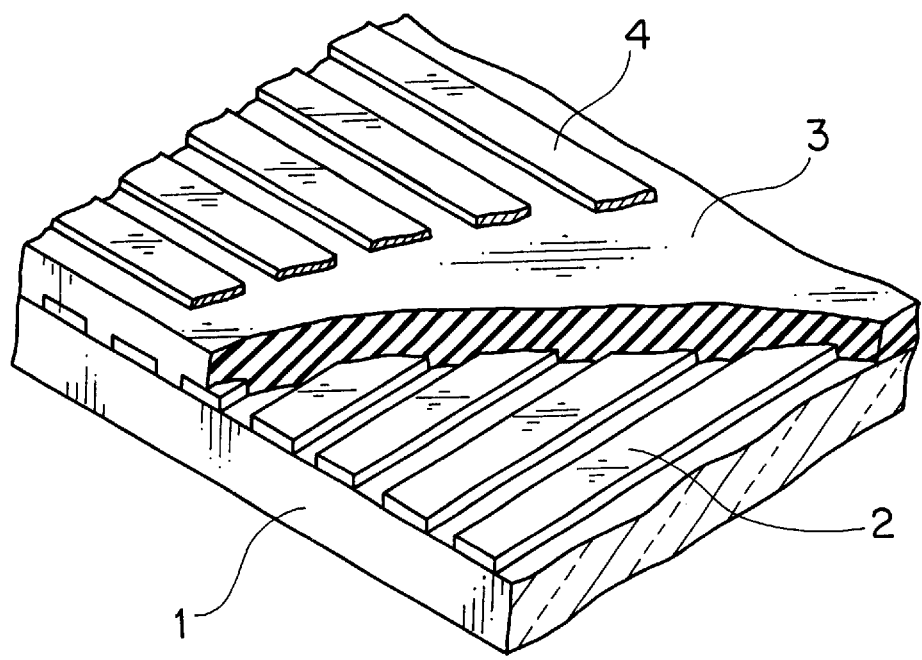
FIG. 7 illustrates a schematic structure of an example of a conventional simple matrix drive-type electroluminescent display unit employing an organic electroluminescent element.
Figure 8:
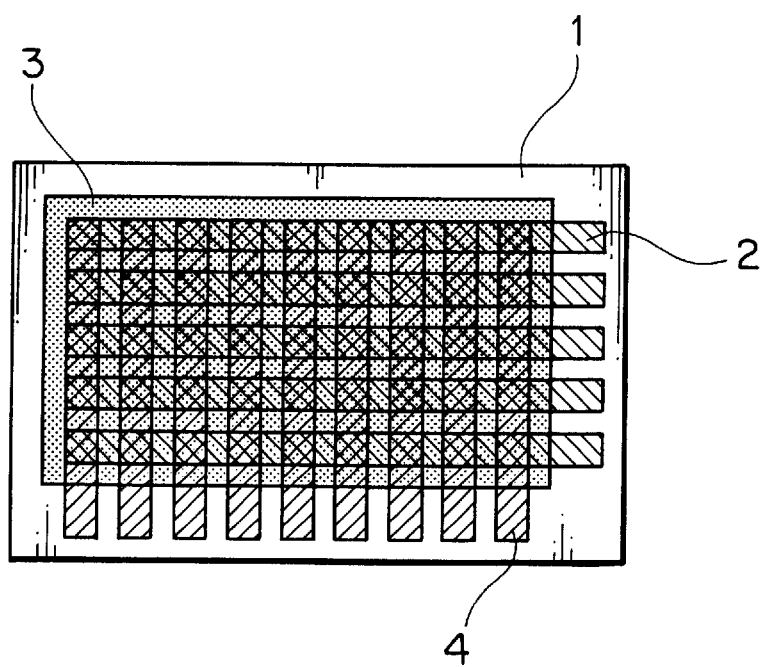
FIG. 8 illustrates an arrangement of transparent electrodes and metal electrodes of the conventional example shown in FIG. 7.

FIGS. 5 and 6 illustrate current and voltage vs. luminance characteristics of the organic electroluminescent element, which is explained with reference to FIG. 1, having or not having the layer 5 for preventing current leak made of Al-pc, respectively.

The current vs. luminance characteristic almost did not depend on whether or not the layer 5 for preventing current leak made of Al-pc was employed, while the luminance of the organic electroluminescent element employing the layer 5 for preventing current leak decreased compared to that of the element employing no layer for preventing current leak due to a voltage drop by the layer 5 for preventing current leak made of Al-pc.

In the above preferred embodiment, a layer that is in contact with the transparent electrodes 2 is employed as the layer 5 for preventing current leak in the organic electroluminescent element, instead, a layer out of a plurality of the organic material layers 3 may be set to be evaporated by laser beam irradiation. In such a case, the laser beam is selected in accordance with a material to be evaporated.

As explained above, a layer being in contact with the transparent board out of a plurality of the organic material layers is set to be the layer for preventing current leak which evaporates by absorbing the laser beam and the laser beam is irradiated onto the current leaking position to evaporate the layer for preventing current leak, thereby forming a space so as to keep the metal electrode apart from the transparent electrode, resulting in a stop of current leak.

The aforementioned preferred embodiments are described to aid in the understanding of the present invention and variations may be made by one skilled in the art without departing from the spirit and scope of the present invention.

What is claimed is:

1. An organic electroluminescent element comprising:
   a transparent board,
   transparent electrodes, a plurality of organic material layers, metal electrodes and a protective layer for preventing current leak, which evaporates when it absorbs a laser beam, wherein the transparent electrodes, the plurality of the organic material layers, and the metal electrodes are formed in order on the transparent board, and wherein the protective layer is formed between the transparent board and the plurality of the organic material layers, and wherein a space is formed between the transparent electrodes and the protective layer where the protective layer absorbs a laser beam.

2. The organic electroluminescent element according to claim 1, wherein a sealing film having stretchability is further formed on the metal electrodes.

3. The organic electroluminescent element according to claim 2, wherein the sealing film having stretchability is made of a material having adhesiveness to the metal electrodes.

4. The organic electroluminescent element according to claim 1, wherein the protective layer for preventing current leak consists of aluminum phthalocyanine.

5. A method of repairing an organic electroluminescent element including transparent electrodes, a plurality of organic material layers and metal electrodes being formed in order on a transparent board and comprising a protective layer for preventing current leak formed between the transparent board and a plurality of the organic material layers, characterized in that a laser beam, having substantially the same wavelength as an absorption wavelength of a material of the protective layer for preventing current leak and/or an organic material which forms a specific organic material layer from among a plurality of the organic material layers, is irradiated onto the protective layer for preventing current leak and/or the specific organic material layer so as to evaporate the protective layer for preventing current leak and/or the specific organic material layer.

6. A method of repairing an organic electroluminescent element according to claim 5, wherein the laser beam is irradiated from the transparent board side.

7. A method of repairing an organic electroluminescent element according to claim 5 or 6, wherein the specific organic material layer is in contact with the transparent electrodes.

* * * * *